US012784854B2

(12) United States Patent
Kim et al.

(10) Patent No.: US 12,784,854 B2
(45) Date of Patent: Nov. 3, 2026

(54) MEMORY DEVICE FOR COUNTING SEQUENCE OF OPERATION

(71) Applicant: SAMSUNG ELECTRONICS CO., LTD., Suwon-si (KR)

(72) Inventors: Youngcho Kim, Suwon-si (KR); Hyunyoung Yoo, Suwon-si (KR); Woobin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 102 days.

(21) Appl. No.: 19/013,956

(22) Filed: Jan. 8, 2025

(65) Prior Publication Data

US 2025/0342897 A1 Nov. 6, 2025

(30) Foreign Application Priority Data

May 2, 2024 (KR) ........................ 10-2024-0058727

(51) Int. Cl.

| | |
|---|---|
| ***G11C 16/04*** | (2006.01) |
| ***G11C 17/16*** | (2006.01) |
| ***G11C 29/02*** | (2006.01) |
| ***G11C 29/52*** | (2006.01) |

(52) U.S. Cl.
CPC ............ *G11C 29/022* (2013.01); *G11C 17/16* (2013.01); *G11C 29/52* (2013.01)

(58) Field of Classification Search
CPC ........ G11C 29/022; G11C 29/52; G11C 17/16
See application file for complete search history.

(56) References Cited

U.S. PATENT DOCUMENTS

| | | | |
|---|---|---|---|
| 8,508,998 B2 | 8/2013 | Haukness | |
| 8,522,081 B2 | 8/2013 | Igarashi | |
| 9,250,992 B1 | 2/2016 | Tam et al. | |
| 10,043,569 B2 | 8/2018 | Park et al. | |
| 10,445,168 B2 | 10/2019 | Mayer | |
| 10,761,728 B2 | 9/2020 | Hong et al. | |
| 2019/0310798 A1* | 10/2019 | Yoon | G06F 3/0659 |
| 2024/0428845 A1* | 12/2024 | Song | G11C 11/4072 |
| 2025/0053336 A1* | 2/2025 | Lee | G06F 3/0656 |

FOREIGN PATENT DOCUMENTS

| | | |
|---|---|---|
| CN | 110990301 | 4/2020 |
| JP | 2002-246991 | 8/2002 |
| KR | 10-2011-0131208 | 12/2011 |
| KR | 10-2017-0030215 | 3/2017 |
| KR | 10-2019-0113430 | 10/2019 |

* cited by examiner

*Primary Examiner* — Pho M Luu
(74) *Attorney, Agent, or Firm* — Fish & Richardson P.C.

(57) ABSTRACT

A memory device includes a memory cell array including a plurality of planes, a peripheral circuit configured to perform an operation with respect to the plurality of planes, and a scheduler configured to control the peripheral circuit, The scheduler also is configured to generate a plurality of operation control signals toggling according to a sequence of sub-operations included in the operation and to perform the operation according to the plurality of operation control signals The memory device also includes an operation sequence verification circuit configured to verify a defect of the operation based on the result of comparing an operation sequence count value obtained by counting the number of times by which a selected operation control signal among the plurality of operation control signals is toggled with an expected count value.

20 Claims, 15 Drawing Sheets

FIG. 7

| CMD | MODE | CNT_SQ | | RESULT |
|---|---|---|---|---|
| | | ACTIVE | DUMP | |
| ERASE | SLC | CNT1 | CNT2 | PASS or FAIL |
| | TLC | CNT3 | CNT4 | PASS or FAIL |
| PGM | SLC | CNT6 | CNT7 | PASS or FAIL |
| | TLC | CNT8 | CNT9 | PASS or FAIL |
| READ | SLC | CNT10 | CNT11 | PASS or FAIL |
| | TLC_LSB | CNT12 | CNT13 | PASS or FAIL |
| | TLC_CSB | CNT14 | CNT15 | PASS or FAIL |
| | TLC_MSB | CNT16 | CNT17 | PASS or FAIL |
| PIR READ | SLC | CNT18 | CNT19 | PASS or FAIL |
| | TLC_LSB | CNT20 | CNT21 | PASS or FAIL |
| | TLC_CSB | CNT22 | CNT23 | PASS or FAIL |
| | TLC_MSB | CNT24 | CNT25 | PASS or FAIL |
| RE PGM | TLC | CNT26 | CNT27 | PASS or FAIL |
| CACHE PGM | TLC | CNT28 | CNT29 | PASS or FAIL |
| CACHE READ | SLC | CNT30 | CNT31 | PASS or FAIL |
| | TLC_LSB | CNT32 | CNT33 | PASS or FAIL |
| | TLC_CSB | CNT34 | CNT35 | PASS or FAIL |
| | TLC_MSB | CNT36 | CNT37 | PASS or FAIL |
| COPY BACK | TLC | CNT38 | CNT39 | PASS or FAIL |

FIG. 9
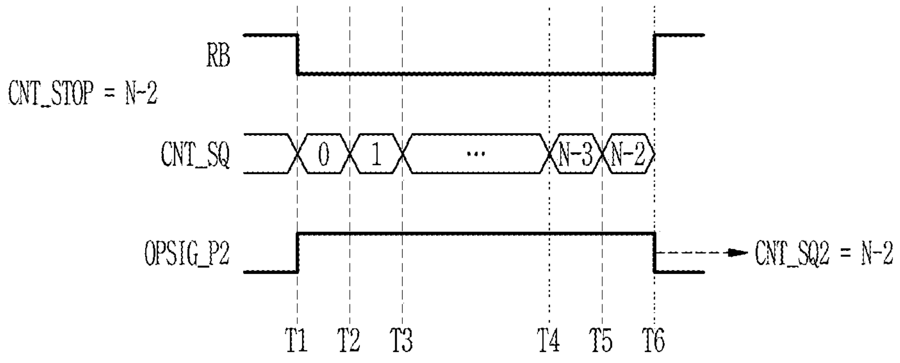
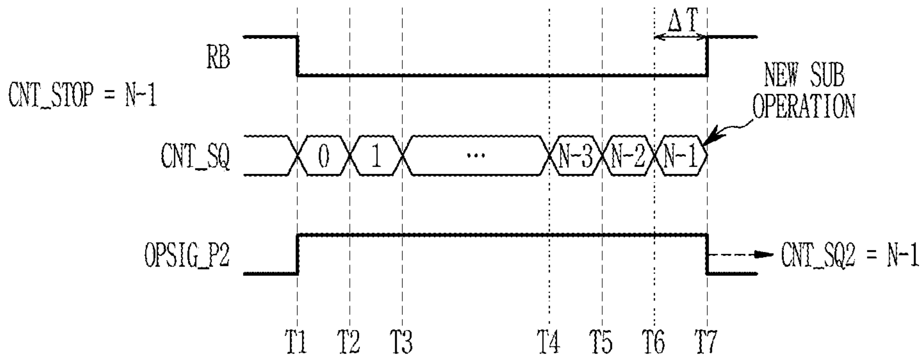

50

MEMORY DEVICE FOR COUNTING SEQUENCE OF OPERATION

CROSS-REFERENCE TO RELATED APPLICATION

This application claims priority to and the benefit of Korean Patent Application No. 10-2024-0058727 filed in the Korean Intellectual Property Office on May 2, 2024, the entire contents of which is incorporated herein by reference.

BACKGROUND

A memory device may generate various control signals to control the operation of circuits included in the memory device. If defects are generated in the control signals or in the operation of circuits, the memory device may not perform its normal operation. Whether the operation of the memory device is performed normally can be confirmed by verifying whether the control signals, which control the operation of the circuits, are generated normally.

SUMMARY

The present disclosure provides a memory device capable of verifying a defect of an operation by using an operation sequence count value, which counts the sequence of operations.

A memory device may include a memory cell array including a plurality of planes, a peripheral circuit configured to perform an operation with respect to the plurality of planes, a scheduler configured to control the peripheral circuit, to generate a plurality of operation control signals that are configured to toggle according to a sequence of sub-operations included in the operation, the scheduler being configured to perform the operation according to the plurality of operation control signals, and an operation sequence verification circuit configured to verify a defect of the operation based on a result of comparing an operation sequence count value with an expected count value, the operation sequence count value being obtained by counting a number of times by which a selected operation control signal among the plurality of operation control signals is toggled.

A memory device may include a scheduler configured to generate a plurality of operation control signals toggled according to a sequence of operations and an operation sequence verification circuit configured to provide a stop signal for stopping an operation to the scheduler based on a result of comparing an operation sequence count value with a stop count value, the operation sequence count value being obtained by counting the number of times by which a selected operation control signal among the plurality of operation control signals is toggled.

A memory device may include a scheduler configured to activate, in response to a command received from the outside, sub-operation control signals for controlling sub-operations included in an operation corresponding to the command, and to generate a termination signal for inactivating the sub-operation control signals for each section for performing the sub-operations, and an operation sequence verification circuit configured to stop the operation or or verify a defect of the operation by performing a count operation for counting a number of times by which the termination signal is toggled, and based on a result comparing an operation sequence count value corresponding to the result of performing the count operation with a reference count value.

BRIEF DESCRIPTION OF THE DRAWINGS

FIG. 7 is a drawing for explaining an operation sequence verification circuit configured to count the sequence of operations according to the type of command according to implementations.

FIG. 8 and FIG. 9 are drawings for explaining an operation sequence verification circuit configured to verify a defect of a new sub-operation according to implementations.

DETAILED DESCRIPTION

Figure 1:
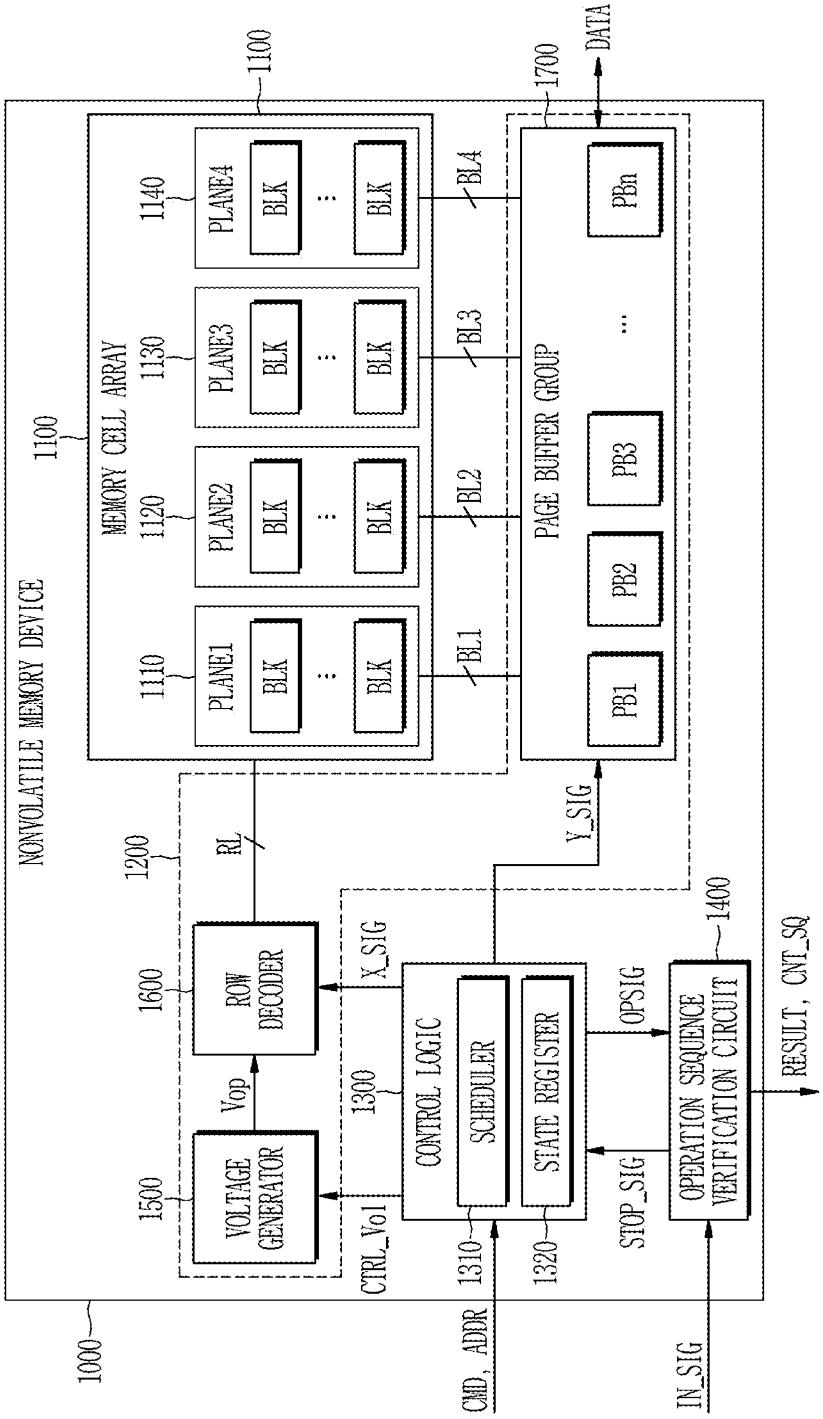
FIG. 1 is a drawing for explaining a memory device according to implementations.

The present disclosure will be described more fully hereinafter with reference to the accompanying drawings, in which exemplary implementations of the disclosure are illustrated. As those skilled in the art would realize, the described implementations may be modified in various different ways, all without departing from the spirit or scope of the present disclosure.

The drawings and description are to be regarded as illustrative in nature and not restrictive, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

In addition, unless explicitly described to the contrary, the word "comprise" and variations such as "comprises" or "comprising", will be understood to imply the inclusion of stated elements but not the exclusion of any other elements.

FIG. 1 is a drawing for explaining a memory device according to implementations.

Referring to FIG. 1, a non-volatile memory device 1000 may include a memory cell array 1100, a peripheral circuit 1200, a control logic 1300, and an operation sequence verification circuit 1400.

The memory cell array 110 may include first to fourth planes 1110 to 1140. The first to fourth planes 1110 to 1140 may be connected to a row decoder 130 through row lines RL. The first to fourth planes 1110 to 1140 may be connected to a page buffer group 140 through first to fourth bitlines BL1 to BL4. Each of the first to fourth planes 1110 to 1140 may include a plurality of memory blocks BLK. Each of the plurality of memory blocks BLK may include a plurality of memory cells. In implementations, the plurality of memory cells may be non-volatile memory cells.

Each of the plurality of memory cells may be configured as a single level cell (SLC) storing one bit of data, a multi-level cell (MLC) storing two bits of data, a triple level cell (TLC) storing three bits of data, a quad level cell (QLC) storing four bits of data, or memory cells storing five bits or more of data.

The peripheral circuit 1200 may drive the memory cell array 1100. For example, the peripheral circuit 1200 may drive the memory cell array 1100, to perform a program operation, a read operation, and an erase operation according to the control of the control logic 1300. In implementations, the peripheral circuit 1200 may apply voltages to the row lines RL and the first to fourth bitlines BL1 to BL4 according to the control of the control logic 1300 or may discharge the applied voltages.

In implementations, the peripheral circuit 1200 may include a voltage generator 1500, a row decoder 1600, and a page buffer group 1700.

The voltage generator 1500 may generate operating voltages Vop by using an external power source voltage supplied to the non-volatile memory device 1000. The voltage generator 1500 may operate in response to the control of the control logic 1300.

In implementations, the voltage generator 1500 may generate the operating voltages Vop used for the program operation, the read operation, and the erase operation. For example, the voltage generator 1500 may generate a program voltage, a pass voltage, a read voltage, and an erase voltage. The operating voltages Vop may be supplied to the memory cell array 1100 by the row decoder 1600.

The row decoder 1600 may be connected to the memory cell array 1100 through the row lines RL. The row lines RL may include string selection lines, wordlines, and ground selection lines.

The row decoder 1600 may be configured to operate in response to the control of the control logic 1300. The row decoder 1600 may receive a row signal X_SIG from a control logic 150. In implementations, the row decoder 1600 may select at least one wordline among a plurality of wordlines based on the row signal X_SIG and may apply the operating voltages Vop provided from the voltage generator 1500 to at least one wordline.

In implementations, at the time of the program operation, the row decoder 1600 may apply the program voltage to a selected wordline among the plurality of wordlines and may apply the pass voltage of a level lower than the program voltage to a non-selected wordline. At the time of a program verification operation, the row decoder 1600 may apply a verification voltage to the selected wordline and may apply verification the pass voltage of a level higher than the verification voltage to the non-selected wordlines.

At the time of the read operation, the row decoder 1600 may apply the read voltage to the selected wordline and may apply read the pass voltage of a level higher than the read voltage to the non-selected wordlines.

The page buffer group 1700 may include a plurality of page buffers PB1 to PBn. The plurality of page buffers PB1 to PBn may be connected to the first to fourth planes 1110 to 1140, respectively, through the first to fourth bitlines BL1 to BL4. The plurality of page buffers PB1 to PBn may operate in response to the control of the control logic 1300.

In implementations, the plurality of page buffers PB1 to PBn may receive data DATA from the outside. The plurality of page buffers PB1 to PBn may select at least one bitline among the first to fourth bitlines BL1 to BL4 based on a column signal Y_SIG received from the control logic 1300.

In implementations, at the time of the program operation, the plurality of page buffers PB1 to PBn may transfer data received from the outside to memory cells of the memory cell array 1100 through the first to fourth bitlines BL1 to BLA. The memory cells may be programmed according to the received data. At the time of the program verification operation, the plurality of page buffers PB1 to PBn may sense the data stored in the memory cells through the first to fourth bitlines BL1 to BL4.

At the time of the read operation, the plurality of page buffers PB1 to PBn may sense the data stored in the memory cells through the first to fourth bitlines BL1 to BLA and may store the sensed data in the plurality of page buffers PB1 to PBn. In implementations, the plurality of page buffers PB1 to PBn may sense the data stored in the first to fourth planes 1110 to 1140 in response to a read command.

The control logic 1300 may be connected to the voltage generator 1500, the row decoder 1600, and the page buffer group 1700. The control logic 1300 may be configured to control the overall operation of the non-volatile memory device 1000. The control logic 1300 may operate in response to a command CMD transferred from the outside. The control logic 1300 may control the voltage generator 1500, the row decoder 1600, and the page buffer group 1700 by generating various signals in response to the command CMD and address ADDR.

In implementations, the control logic 1300 may include a scheduler 1310 and a state register 1320.

In implementations, the scheduler 1310 may generate operation signals OPSIG in response to the command CMD received from the outside. The scheduler 1310 may control the peripheral circuit 1200 to perform an operation corresponding to the command CMD based on the operation signals OPSIG. The operation corresponding to the command CMD may be the program operation, the read operation, or the erase operation. The peripheral circuit 1200 may perform an operation with respect to the first to fourth planes 1110 to 1140 in response to the operation signals OPSIG. The scheduler 1310 may provide the operation signals OPSIG to the operation sequence verification circuit 1400.

In implementations, the operation signals OPSIG may include a voltage control signal CTRL_Vol, the row signal X_SIG, and the column signal Y_SIG provided to the voltage generator 1500, the row decoder 1600, and the page buffer group 1700.

In implementations, the operation signals OPSIG may include a plurality of plane operation signals and a plurality of operation control signals. The plurality of plane operation signals may be a signal activated while the first to fourth planes 1110 to 1140 perform the operation corresponding to the command CMD. The plurality of plane operation signals may be inactivated when the operation with respect to the first to fourth planes 1110 to 1140 is completed.

In implementations, the plurality of operation control signals may be a signal for controlling the operation with respect to the first to fourth planes 1110 to 1140. The plurality of operation control signals may be a signal toggled according to the sequence of operation corresponding to the command CMD. The plurality of operation control signals may be a signal toggled for each section in which sub-operations included in the operation are performed.

In implementations, the scheduler 1310 may generate a plurality of sub-operation control signals for controlling the sub-operations included in the operation corresponding to the command CMD, respectively. The scheduler 1310 may control the peripheral circuit 1200 to perform the sub-operations included in the operation corresponding to the command CMD based on the plurality of sub-operation control signals, respectively. In implementations, the page buffer group 1700 may precharge or discharge the first to fourth bitlines BL1 to BLA based on the plurality of sub-operation control signals.

In implementations, the state register 1320 may store operation status data representing a state of the operation performed by the first to fourth planes 1110 to 1140. In implementations, the state register 1320 may store operation status data representing a busy state while the first to fourth planes 1110 to 1140 perform operations. In implementations, when the operation with respect to the first to fourth planes 1110 to 1140 is completed, the state register 1320 may store an operation status data representing a ready state. The operation status data stored in the state register 1320 may be output to the outside according to the command CMD received from the outside.

In implementations, the operation sequence verification circuit 1400 may verify a defect of the operation with respect to the first to fourth planes 1110 to 1140 based on the operation signals OPSIG received from a scheduler 1300.

In implementations, the operation sequence verification circuit 1400 may receive an input signal IN_SIG from the outside and may select one among the plurality of operation control signals based on the input signal IN_SIG and may perform a count operation for counting the number of times by which the selected operation control signal is toggled. The operation sequence verification circuit 1400 may output an operation sequence count value CNT_SQ corresponding to the result of performing the count operation to the outside.

In implementations, the operation sequence verification circuit 1400 may verify a defect of the operation corresponding to the command CMD based on the result comparing the operation sequence count value CNT_SQ corresponding to the result of performing the count operation with an expected count value. The operation sequence verification circuit 1400 may output data RESULT representing the result of verifying the defect of the operation to the outside.

In implementations, when the operation sequence count value CNT_SQ is equal to the expected count value, the operation sequence verification circuit 1400 may generate a pass data representing that the operation corresponding to the command CMD is not defective. When the operation sequence count value CNT_SQ and the expected count value are different from each other, the operation sequence verification circuit 1400 may generate a fail data representing that the operation corresponding to the command is defective.

The operation sequence verification circuit 1400 may output the pass data or the fail data to the outside based on the operation status data stored in the state register 1320. In implementations, when the operation status data representing the ready state is stored in the state register 1320, the operation sequence verification circuit 1400 may output the pass data or the fail data to the outside.

In implementations, the operation sequence verification circuit 1400 may generate a stop signal STOP_SIG for stopping the operation corresponding to the command CMD based on the result of comparing the operation sequence count value CNT_SQ and a stop count value. When the operation sequence count value CNT_SQ reaches the stop count value, the operation sequence verification circuit 1400 may provide the stop signal to the scheduler 1310. The scheduler 1310 may control the peripheral circuit 1200 to stop the operation corresponding to the command CMD in response to the stop signal STOP_SIG. In implementations, the scheduler 1310 may inactivate the operation signals OPSIG in response to the stop signal STOP_SIG.

In implementations, the scheduler 1310 may control the peripheral circuit 1200 to stop the operation corresponding to the command CMD in response to a reset command received from the outside. In implementations, the scheduler 1310 may inactivate the operation signals OPSIG in response to the reset command.

In implementations, the operation sequence verification circuit 1400 may stop the count operation of counting the number of times by which the selected operation control signal is toggled based on operation signals inactivated according to the reset command. The operation sequence verification circuit 1400 may output the operation sequence count value CNT_SQ of the stopped time point to the outside.

Figure 2:
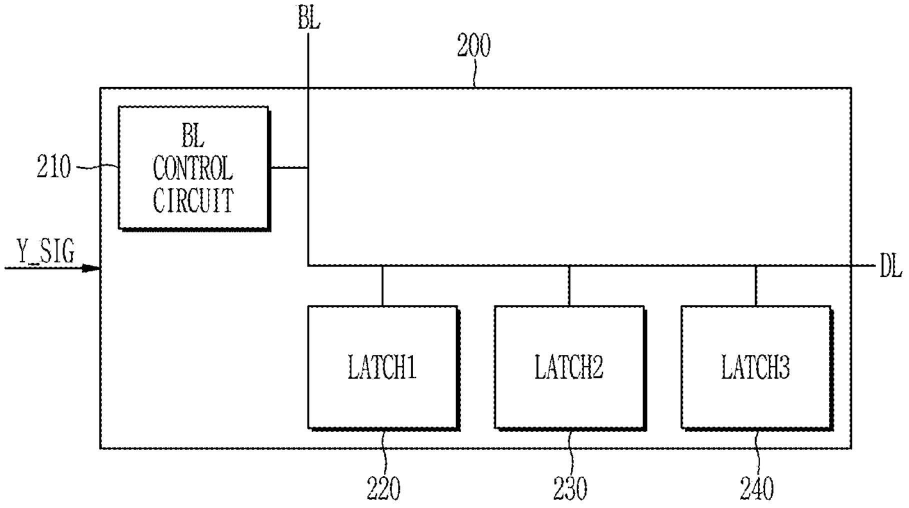
FIG. 2 is a drawing for explaining a page buffer according to implementations.

FIG. 2 is a drawing for explaining a page buffer according to implementations.

Referring to FIG. 2, a page buffer 200 of FIG. 2 may be one of the plurality of page buffers PB1 to PBn of FIG. 1. The page buffer 200 may include a bitline control circuit 210, a first latch 220, a second latch 230, and a third latch 240. In implementations, the number of latches included in the page buffer 200 may be two or less, or four or more. The page buffer 200 may be connected to a memory cell through a bitline BL. The page buffer 200 may output the data stored in the first latch 220, the second latch 230, and the third latch 240 to the outside through a data line DL.

The bitline control circuit 210 may receive the column signal Y_SIG from the control logic 1300. The bitline control circuit 210 may control the operation of the page buffer 200 in response to the column signal Y_SIG. The column signal Y_SIG may include the plurality of sub-operation control signals controlling the sub-operations included in the operations corresponding to commands, respectively.

First to third latches 220 to 240 may store data sensed from memory cells connected to bitlines. In implementations, the first to third latches 220 to 240 may store a least significant bit (LSB), a center significant bit (CSB), a most significant bit (MSB) data, which are sensed from the memory cell. In implementations, the first to third latches 220 to 240 may store program verification data sensed from the memory cell by the program verification operation.

In implementations, the third latch 240 may be a cache latch. In implementations, the data stored in the first latch may be transferred to the cache latch, and data transferred to the cache latch may be output to the outside through the data line DL.

In implementations, the page buffer 200 may perform a page buffer initialization operation for resetting the first to third latches 220 to 240 in response to the column signal Y_SIG. The page buffer 200 may perform a precharge operation for precharging the voltage of the bitline in response to the column signal Y_SIG. The page buffer 200 may perform a develop operation for changing the voltage of the bitline according to the threshold voltage of the memory cell connected to the bitline in response to the column signal Y_SIG. The page buffer 200 may perform a sensing operation for sensing the data stored in the memory cell connected to the bitline in response to the column signal Y_SIG. The page buffer 200 may perform a recovery operation for discharging the voltage of the bitline in response to the column signal Y_SIG. In implementations, the page buffer 200 may perform a dump operation for transferring data between the first to third latches 220 to 240 in response to the column signal Y_SIG.

Figure 3:
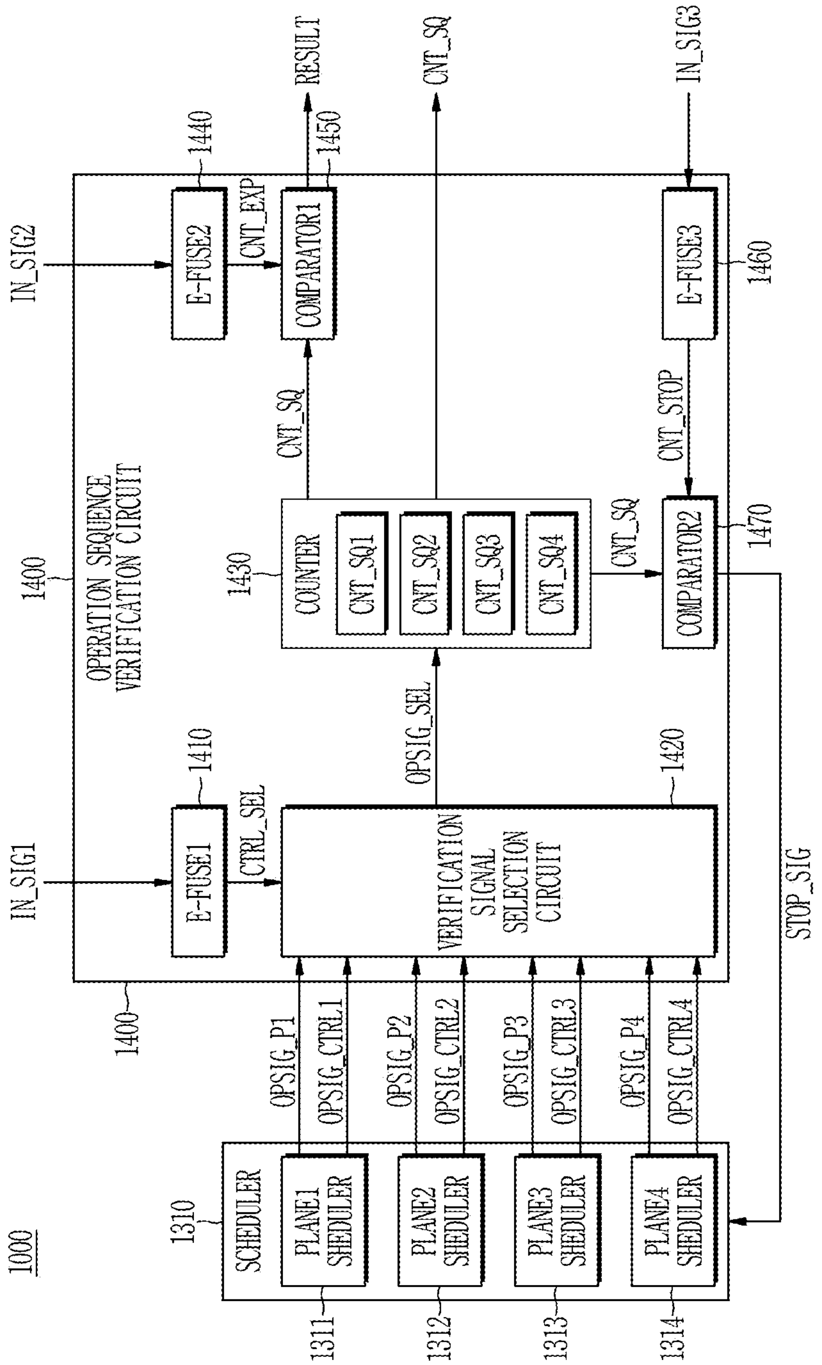
FIG. 3 is a drawing for explaining an operation sequence verification circuit according to implementations.

FIG. 3 is a drawing for explaining an operation sequence verification circuit according to implementations.

Referring to FIG. 3, the non-volatile memory device 1000 may include the scheduler 1310 and the operation sequence verification circuit 1400. The scheduler 1310 may include a first plane scheduler 1311, a second plane scheduler 1312, a third plane scheduler 1313, and a fourth plane scheduler 1314. The operation sequence verification circuit 1400 may include a first electronic fuse (E-FUSE) 1410, a verification signal selection circuit 1420, a counter 1430, a second electronic fuse 1440, a first comparator 1450, a third electronic fuse 1460, and a second comparator 1470.

In implementations, first to fourth plane schedulers 1311 to 1314 may each control the operation with respect to the first to fourth planes 1110 to 1140. The first to fourth plane schedulers 1311 to 1314 may activate first to fourth plane operation signals OPSIG_P1 to OPSIG_P4 for performing the operation with respect to each of the first to fourth planes 1110 to 1140, respectively, in response to a command received from the outside. In implementations, the first plane scheduler 1311 may activate a first plane operation signal OPSIG_P1 for performing an operation with respect to a first plane 1110.

In implementations, the first to fourth plane schedulers 1311 to 1314 may generate first to fourth operation control signals OPSIG_CTRL1 to OPSIG_CTRL4 for controlling an operation with respect to each of the first to fourth planes 1110 to 1140, respectively. The first to fourth operation control signals OPSIG_CTRL1 to OPSIG_CTRL4 may be a signal toggled according to the sequence of operations corresponding to commands. In implementations, the first plane scheduler 1311 may generate first operation control signals OPSIG_CTRL1 for controlling the operation with respect to the first plane 1110.

In implementations, the first to fourth plane schedulers 1311 to 1314 may provide the first to fourth plane operation signals OPSIG_P1 to OPSIG_P4 and the first to fourth operation control signals OPSIG_CTRL1 to OPSIG_CTRL4 to the verification signal selection circuit 1420.

The first electronic fuse 1410 may receive a first input signal IN_SIG1 from the outside. The first input signal IN_SIG1 may be included in the input signal IN_SIG of FIG. 1. The first electronic fuse 1410 may generate a selection control signal CTRL_SEL for selecting operation control signals from each of the first to fourth operation control signals OPSIG_CTRL1 to OPSIG_CTRLA based on the first input signal IN_SIG1. In implementations, the first electronic fuse 1410 may generate the selection control signal CTRL_SEL for selecting one of the first operation control signals OPSIG_CTRL1, selecting one of second operation control signals OPSIG_CTRL2, selecting one of third operation control signals OPSIG_CTRL3, and selecting one of fourth operation control signals OPSIG_CTRL4. The first electronic fuse 1410 may provide the selection control signal CTRL_SEL to the verification signal selection circuit 1420.

The verification signal selection circuit 1420 may select one operation control signal from each of the first to fourth operation control signals OPSIG_CTRL1 to OPSIG_CTRL4 based on the selection control signal CTRL_SEL and may provide the selected operation control signals OPSIG_SEL to the counter 1430. The verification signal selection circuit 1420 may provide a selected first operation control signal among the first operation control signals OPSIG_CTRL1, a selected second operation control signal among the second operation control signals OPSIG_CTRL2, a selected third operation control signal among the third operation control signals OPSIG_CTRL3, and a selected fourth operation control signal among the fourth operation control signals OPSIG_CTRL4 to the counter 1430, according to the selection control signal CTRL_SEL.

In implementations, the verification signal selection circuit 1420 may provide the selected first to fourth operation control signals to the counter 1430 while the first to fourth plane operation signals OPSIG_P1 to OPSIG_P4 are activated. When the first to fourth plane operation signals OPSIG_P1 to OPSIG_P4 are inactivated, the verification signal selection circuit 1420 may not provide the selected first to fourth operation control signals to the counter 1430.

The counter 1430 may perform the count operation for counting the number of times by which the selected operation control signal is toggled while the plane operation signal is activated.

In implementations, the counter 1430 may receive the selected first to fourth operation control signals and may perform the count operation for counting the number of times by which the selected first to fourth operation control signal is toggled while the first to fourth plane operation signals OPSIG_P1 to OPSIG_P4 are activated. When the first to fourth plane operation signals OPSIG_P1 to OPSIG_P4 are inactivated, the counter 1430 may stop the count operation.

In implementations, the counter 1430 may store the operation sequence count values CNT_SQ obtained by counting the number of times by which the selected operation control signals is toggled. In implementations, the counter 1430 may store a first operation sequence count value CNT_SQ1 obtained by counting the number of times by which the selected first operation control signal is toggled, a second operation sequence count value CNT_SQ2 obtained by counting the number of times by which the selected second operation control signal is toggled, a third operation sequence count value CNT_SQ3 obtained by counting the number of times by which the selected third operation control signal is toggled, and a fourth operation sequence count value CNT_SQ4 obtained by counting the number of times by which the selected fourth operation control signal is toggled.

The counter 1430 may provide the operation sequence count values CNT_SQ to the first comparator 1450 and the second comparator 1470. The counter 1430 may output the operation sequence count values CNT_SQ to the outside.

The second electronic fuse 1440 may receive a second input signal IN_SIG2 from the outside. The second input signal IN_SIG2 may be included in the input signal IN_SIG of FIG. 1. The second input signal IN_SIG2 may be a signal received to generate the expected count values.

The second electronic fuse 1440 may generate information CNT_EXP on the expected count values based on the second input signal IN_SIG2 and may provide the information CNT_EXP on the expected count values to the first comparator 1450. The expected count values may be count values expected when the operation with respect to the first to fourth planes 1110 to 1140 is normally performed according to the sequence of operation.

The first comparator 1450 may verify whether each of the operations with respect to the first to fourth planes 1110 to 1140 is defective based on the result of comparing each of the operation sequence count values CNT_SQ with the expected count values. The first comparator 1450 may output the data RESULT representing the result of verifying the defect of the operation to the outside based on the result of comparing each of the operation sequence count values CNT_SQ with the expected count values. The data representing the result of verifying the defect of the operation may include pass data or fail data, which represent that each of the operations with respect to the first to fourth planes 1110 to 1140 is normally performed or is defective, respectively.

In implementations, the first comparator 1450 may output the data RESULT representing the result of verifying the defect of each of the operations with respect to the first to fourth planes 1110 to 1140 to the outside based on the result of respectively comparing first to fourth operation sequence count values CNT_SQ1 to CNT_SQ4 and first to fourth expected count values.

In implementations, when the first operation sequence count value CNT_SQ1 is equal to the first expected count value, the first comparator 1450 may output the pass data representing that the operation with respect to the first plane 1110 is normally performed, to the outside. In implementations, when the first operation sequence count value CNT_SQ1 and the first expected count value are different from each other, the first comparator 1450 may output the fail data representing that the operation with respect to the first plane 1110 is defective, to the outside. In the same way, the first comparator 1450 may output the data RESULT representing the result of verifying the defect of the operation with respect to a second plane 1120 to the outside based on the result of comparing the second operation sequence count value CNT_SQ2 and the second expected count value.

The third electronic fuse 1460 may receive a third input signal IN_SIG3 from the outside. The third input signal IN_SIG3 may be included in the input signal IN_SIG of FIG. 1. The third input signal IN_SIG3 may be a signal received to generate the stop count value.

The third electronic fuse 1460 may generate information CNT_STOP on the stop count value based on the third input signal IN_SIG3 and may provide the information CNT_STOP on the stop count value to the second comparator 1470.

The second comparator 1470 may provide the stop signal STOP_SIG for stopping the operation with respect to the first to fourth planes 1110 to 1140 to the scheduler 1310 based on the result of comparing the operation sequence count values CNT_SQ with the stop count value. When the operation sequence count values CNT_SQ reaches the stop count value, the second comparator 1470 may provide the stop signal STOP_SIG to the scheduler 1310. The scheduler 1310 may control the peripheral circuit 1200 to stop the operation with respect to the first to fourth planes 1110 to 1140 based on the stop signal STOP_SIG.

Figure 4:
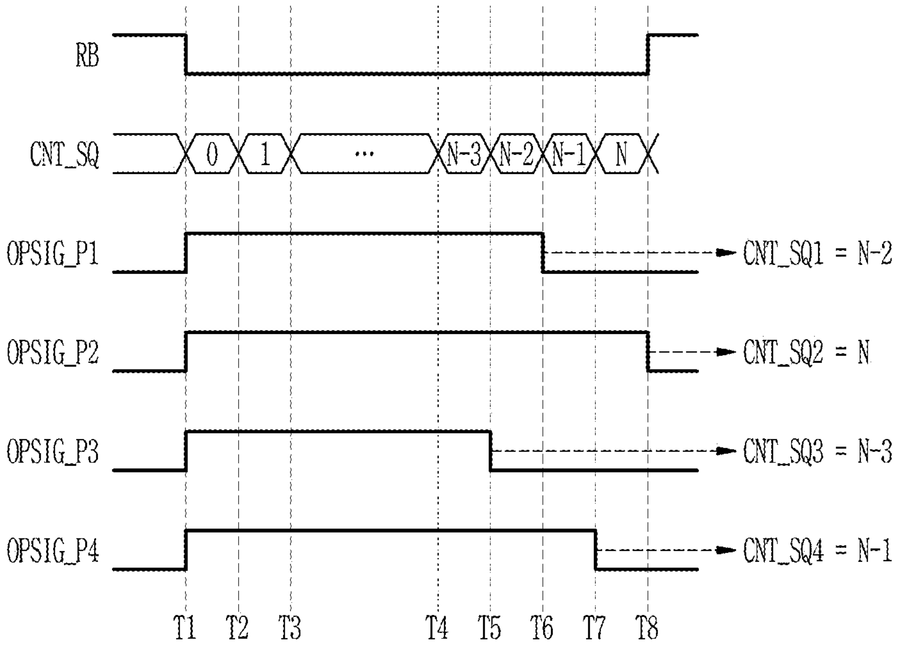
FIG. 4 is a drawing for explaining an operation sequence verification circuit configured to perform a count operation while a plane operation signal according to implementations is activated.

FIG. 4 is a drawing for explaining an operation sequence verification circuit configured to perform the count operation while a plane operation signal according to implementations is activated.

Referring to FIG. 4, the scheduler 1310 may activate the first to fourth plane operation signals OPSIG_P1 to OPSIG_P4 for performing the operation with respect to the first to fourth planes 1110 to 1140, respectively, in response to command received from the outside. The state in which the plane operation signal is activated may correspond to the state in which the level of the plane operation signal is a high level. The state in which the plane operation signal is inactivated may correspond to the state in which the level of the plane operation signal is a low level.

In implementations, at a time point T1, the scheduler 1310 may transition the level of the first to fourth plane operation signals OPSIG_P1 to OPSIG_P4 from the low level to the high level. The operation sequence verification circuit 1400 may receive the first to fourth plane operation signals OPSIG_P1 to OPSIG_P4 and may perform the count operation of counting the number of times by which the selected operation control signals among the plurality of operation control signals is toggled while the first to fourth plane operation signals OPSIG_P1 to OPSIG_P4 are activated.

In implementations, at a time point T2, when the selected first operation control signal among the first operation control signals OPSIG_CTRL1 is toggled, the operation sequence verification circuit 1400 may increase the first operation sequence count value CNT_SQ1 from "0" to "1". In the same way, at the time point T2, when the selected second to fourth operation control signals are toggled, the operation sequence verification circuit 1400 may increase each of second to fourth operation sequence count values CNT_SQ2 to CNT_SQ4 from "0" to "1".

In implementations, the operation sequence verification circuit 1400 may increase the first to fourth operation sequence count values CNT_SQ1 to CNT_SQ4 whenever the selected first to fourth operation control signals is toggled while the first to fourth plane operation signals OPSIG_P1 to OPSIG_P4 are activated.

In implementations, at a time point T5, when the operation with respect to a third plane 1130 is completed, the scheduler 1310 may inactivate a third plane operation signal OPSIG_P3. At the time point T5, the scheduler 1310 may transition the level of the third plane operation signal OPSIG_P3 from the high level to the low level. When the third plane operation signal OPSIG_P3 is inactivated, the operation sequence verification circuit 1400 may stop the count operation of counting the number of times by which the selected third operation control signal among the third operation control signals OPSIG_CTRL3 is toggled. The operation sequence verification circuit 1400 may store "N−3", which is the third operation sequence count value CNT_SQ3 obtained by counting the number of times by which the selected third operation control signal is toggled until the time point T5.

In implementations, at a time point T6, when the operation with respect to the first plane 1110 is completed, the scheduler 1310 may inactivate the first plane operation signal OPSIG_P1. When the first plane operation signal OPSIG_P1 is inactivated, the operation sequence verification circuit 1400 may stop the count operation with respect to the selected first operation control signal. The operation sequence verification circuit 1400 may store "N−2", which is the first operation sequence count value CNT_SQ1 obtained by counting the number of times by which the selected first operation control signal is toggled until the time point T6.

In implementations, at a time point T7, when the operation with respect to a fourth plane 1140 is completed, the scheduler 1310 may inactivate a fourth plane operation signal OPSIG_P4. The operation sequence verification circuit 1400 may store "N−1", which is the fourth operation sequence count value CNT_SQ4 obtained by counting the number of times by which the selected fourth operation control signal is toggled until the time point T7.

In implementations, at a time point T8, when the operation with respect to the second plane 1120 is completed, the scheduler 1310 may inactivate a second plane operation signal OPSIG_P2. The operation sequence verification circuit 1400 may store "N", which is the second operation sequence count value CNT_SQ4 obtained by counting the number of times by which the selected second operation control signal is toggled until the time point T8.

In implementations, the operation sequence verification circuit 1400 may count the number of times by which the selected first to fourth operation control signals are toggled while the operation with respect to the first to fourth planes 1110 to 1140 is performed and may store the first to fourth operation sequence count values CNT_SQ1 to CNT_SQ4 corresponding to the counting result. The operation sequence verification circuit 1400 may output "N−2", "N", "N−3", "N−1" corresponding to the first to fourth operation sequence count values CNT_SQ1 to CNT_SQ4 to the outside.

Figure 5:
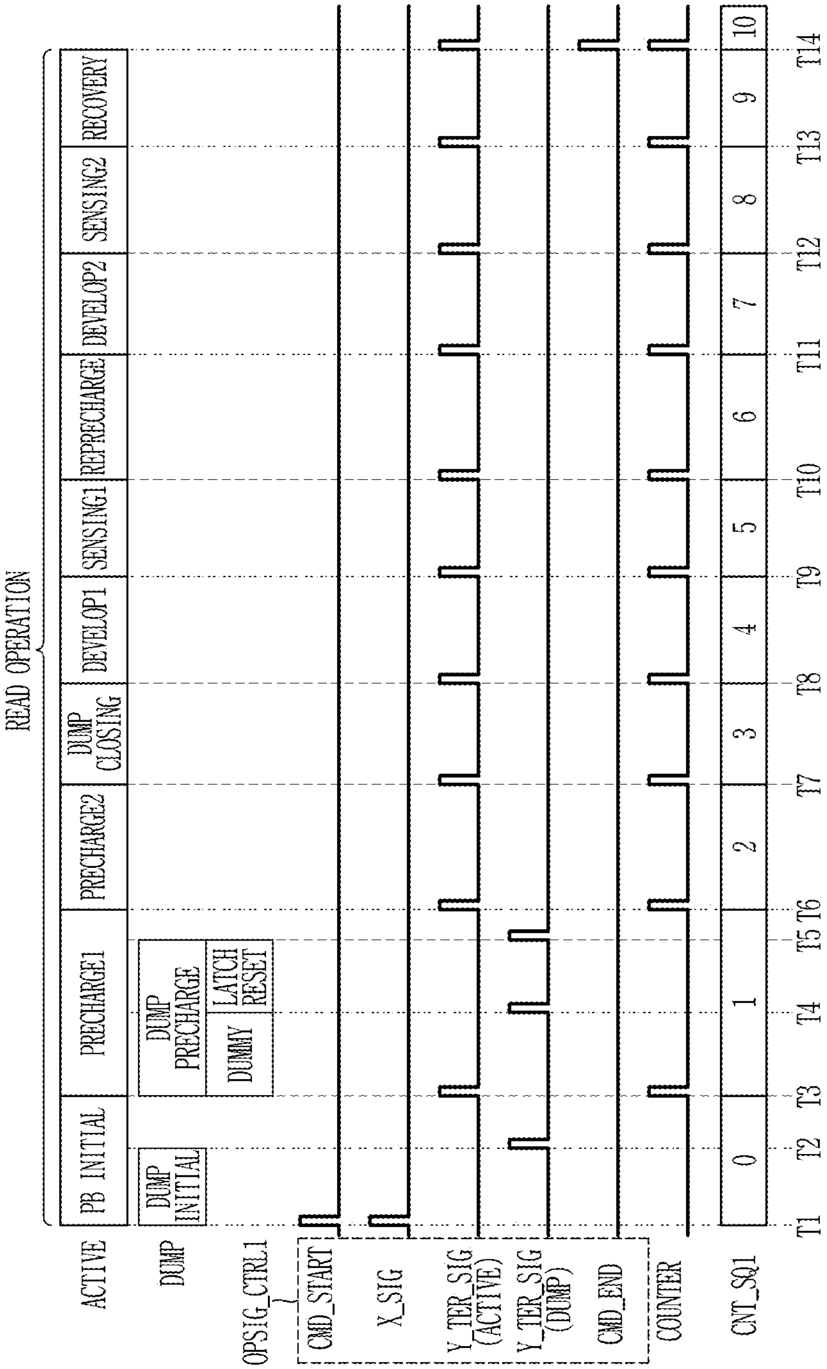
FIG. 5 and FIG. 6 are drawings for explaining operation control signals according to implementations.
Figure 6:
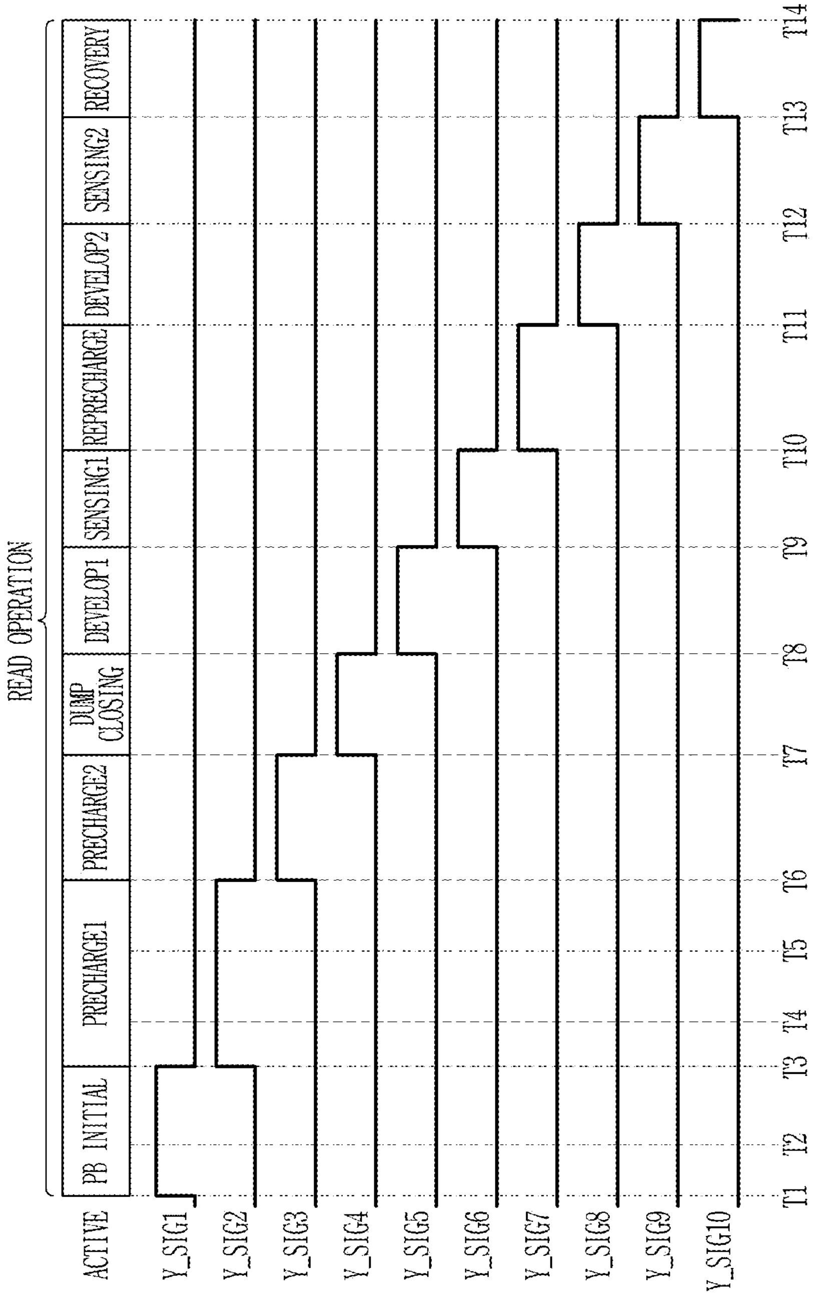

FIG. 5 and FIG. 6 are drawings for explaining operation control signals according to implementations.

With reference to FIG. 5 and FIG. 6, the case of counting the number of times by which the selected first operation control signal among first operation control signals OPISG_CTRL1 for controlling the operation with respect to the first plane 1110 is toggled will be described in detail. The description that will be made with reference to FIG. 5 and FIG. 6 may be equally applied to the case of counting the number of times by which the selected second to fourth operation control signals among second to fourth operation control signals for controlling the operation with respect to the second to fourth planes are toggled.

First, referring to FIG. 5, the scheduler 1310 may receive the read command from the outside and may control the peripheral circuit 1200 to perform the read operation corresponding to the read command. The read operation may include an active operation ACTIVE and a dump operation DUMP. The active operation ACTIVE and the dump operation DUMP may include sub-operations. In implementations, the active operation ACTIVE may include a page buffer initialization operation PB INITIAL, a first precharge operation PRECHARGE1, a second precharge operation PRECHARGE2, a dump closing operation DUMP CLOSING, a first develop operation DEVELOP1, a first sensing operation SENSING1, a re-precharge operation REPRECHARGE, a second develop operation DEVELOP2, a second sensing operation SENSING2, and a recovery operation RECOVERY. The dump operation DUMP may include a dump initialization operation DUMP INITIAL, a dump precharge operation DUMP PRECHARGE, a dummy operation DUMMY, and a latch reset operation LATCH RESET.

In implementations, the scheduler 1310 may generate the first operation control signals OPSIG_CTRL1 in response to the read command and may control the peripheral circuit 1200 to sequentially perform the sub-operations included in the read operation according to the first operation control signals OPSIG_CTRL1. The first operation control signals OPSIG_CTRL1 may be toggled according to the sequence of the sub-operations included in the read operation. In implementations, the first operation control signals OPSIG_CTRL1 may include a command start signal CMD_START, the row signal X_SIG, an active column termination signal Y_TER_SIG(ACTIVE), a dump column termination signal Y_TER_SIG(DUMP), and a command end signal CMD_END.

In implementations, at the time point T1, the scheduler 1310 may toggle the command start signal CMD_START in response to the read command. In implementations, the command start signal CMD_START may be a signal for initiating performing the read operation.

At the time point T1, the scheduler 1310 may toggle the row signal X_SIG as the command start signal CMD_START is toggled. In implementations, the row signal X_SIG may be a signal that controls the row decoder 1600.

In implementations, the scheduler 1310 may toggle the active column termination signal Y_TER_SIG(ACTIVE) for each section in which the sub-operations included in the active operation ACTIVE are performed. The active column termination signal Y_TER_SIG(ACTIVE) may be a signal that terminates performing of the sub-operations included in the active operation ACTIVE.

In implementations, in a section T1 to T3, the page buffer 200 may perform the page buffer initialization operation PB INITIAL. At a time point T3, the scheduler 1310 may toggle the active column termination signal Y_TER_SIG(ACTIVE). At the time point T3, the page buffer 200 may terminate the page buffer initialization operation PB INITIAL as the active column termination signal Y_TER_SIG (ACTIVE) is toggled and may perform the first precharge operation PRECHARGE1, which is a subsequent operation.

In implementations, in a section T3 to T6, the page buffer 200 may perform the first precharge operation PRECHARGE1. At the time point T6, the page buffer 200 may terminate the first precharge operation PRECHARGE1 as the active column termination signal Y_TER_SIG(ACTIVE) is toggled and may perform the second precharge operation PRECHARGE2, which is a subsequent operation.

In implementations, the page buffer 200 may sequentially perform the page buffer initialization operation PB INITIAL, the first precharge operation PRECHARGE1, the second precharge operation PRECHARGE2, the dump closing operation DUMP CLOSING, the first develop operation DEVELOP1, the first sensing operation SENSING1, the re-precharge operation REPRECHARGE, the second develop operation DEVELOP2, the second sensing operation SENSING2, and the recovery operation RECOVERY according to the active column termination signal Y_TER_SIG(ACTIVE) toggled by the scheduler 1310.

In implementations, the scheduler 1310 may toggle the dump column termination signal Y_TER_SIG(DUMP) for each section in which the sub-operations included in the dump operation DUMP are performed. The dump column termination signal Y_TER_SIG(DUMP) may be a signal that terminates performing of the sub-operations included in the dump operation DUMP.

In implementations, in a section T1 to T2, the page buffer 200 may perform the dump initialization operation DUMP INITIAL. At the time point T2, the scheduler 1310 may toggle the dump column termination signal Y_TER_SIG (DUMP). At the time point T2, the page buffer 200 may terminate the dump initialization operation DUMP INITIAL as the dump column termination signal Y_TER_SIG (DUMP) is toggled.

At the time point T3, the page buffer 200 may perform the dump precharge operation DUMP PRECHARGE and the dummy operation DUMMY. At a time point T4, the scheduler 1310 may toggle the dump column termination signal Y_TER_SIG(DUMP). At the time point T4, based on the dump column termination signal Y_TER_SIG(DUMP) being toggled, the page buffer 200 may terminate the dummy operation DUMMY and perform a latch reset operation LATCH RESET.

At the time point T5, the scheduler 1310 may toggle the dump column termination signal Y_TER_SIG(DUMP). At the time point T5, the page buffer 200 may terminate the dump precharge operation DUMP PRECHARGE and the latch reset operation LATCH RESET as the dump column termination signal Y_TER_SIG(DUMP) is toggled.

At a time point T14, the scheduler 1310 may toggle the command end signal CMD_END. The command end signal CMD_END may be a signal that terminates performing of the read operation corresponding to the read command.

In implementations, the counter 1430 may count the number of times by which the selected signal among the command start signal CMD_START, the row signal X_SIG, the active column termination signal Y_TER_SIG(ACTIVE), the dump column termination signal Y_TER_SIG(DUMP), and the command end signal CMD_END included in the first operation control signals OPSIG_CTRL1 is toggled.

In implementations, the counter 1430 may count the number of times by which the active column termination signal Y_TER_SIG(ACTIVE) is toggled. At the time point T3, when the active column termination signal Y_TER_SIG(ACTIVE) is toggled, the counter 1430 may increase the first operation sequence count value CNT_SQ1 from "0" to "1". The counter 1430 may increase the first operation sequence count value CNT_SQ1 whenever the active column termination signal Y_TER_SIG(ACTIVE) is toggled. In implementations, when the sub-operations included in the active operation ACTIVE is terminated, the counter 1430 may store the first operation sequence count value CNT_SQ1 corresponding to "10".

Subsequently, referring to FIG. 6, the scheduler 1310 may generate sub-operation control signals controlling the sub-operations included in the read operation, respectively. In implementations, sub-operation control signals may include first to tenth sub-operation control signals Y_SIG1 to Y_SIG10. Each of the first to tenth sub-operation control signals Y_SIG1 to Y_SIG10 may be signals for controlling the page buffer initialization operation PB INITIAL, the first precharge operation PRECHARGE1, the second precharge operation PRECHARGE2, the dump closing operation DUMP CLOSING, the first develop operation DEVELOP1, the first sensing operation SENSING1, the re-precharge operation REPRECHARGE, the second develop operation DEVELOP2, the second sensing operation SENSING2, and the recovery operation RECOVERY, which are included in the active operation ACTIVE.

In the section T1 to T3, the scheduler 1310 may activate a first sub-operation control signal Y_SIG1. The first sub-operation control signal Y_SIG1 may be a signal that controls the page buffer initialization operation PB INITIAL.

In implementations, at the time point T3, the scheduler 1310 may toggle the active column termination signal Y_TER_SIG(ACTIVE). At the time point T3, the first sub-operation control signal Y_SIG1 may be inactivated as the active column termination signal Y_TER_SIG(ACTIVE) is toggled.

In the section T3 to T6, the scheduler 1310 may activate a second sub-operation control signal Y_SIG2. The second sub-operation control signal Y_SIG2 may be a signal that controls the first precharge operation PRECHARGE1.

In implementations, at the time point T6, the scheduler 1310 may toggle the active column termination signal Y_TER_SIG(ACTIVE). At the time point T6, the second sub-operation control signal Y_SIG2 may be inactivated as the active column termination signal Y_TER_SIG(ACTIVE) is toggled.

In implementations, the scheduler 1310 may toggle the active column termination signal Y_TER_SIG(ACTIVE) at each of time points T7, T8, T9, T10, T11, T12, T13, and T14. The third to tenth sub-operation control signals Y_SIG3 to Y_SIG10 that control the second precharge operation PRECHARGE2, the dump closing operation DUMP CLOSING, the first develop operation DEVELOP1, the first sensing operation SENSING1, the re-precharge operation REPRECHARGE, the second develop operation DEVELOP2, the second sensing operation SENSING2, and the recovery operation RECOVERY, respectively, may be inactivated as the active column termination signal Y_TER_SIG(ACTIVE) is toggled.

FIG. 7 is a drawing for explaining an operation sequence verification circuit configured to count the sequence of operations according to the type of command according to implementations.

Referring to FIG. 7, the operation sequence verification circuit 1400 may count the number of times by which the operation control signals are toggled depending on the type of command and may store the operation sequence count value corresponding to the counting result.

In implementations, the scheduler 1310 may generate the erase operation control signals in response to an erase command ERASE of an SLC mode or a TLC mode. The operation sequence verification circuit 1400 may store the erase operation sequence count values CNT1, CNT2, CNT3, and CNT4 obtained by counting the number of toggling times according to a sequence of the erase operation of a selected erase operation control signal among the erase operation control signals. The operation sequence verification circuit 1400 may output the pass or fail data PASS or FAIL representing the result of verifying the defect of the erase operation to the outside based on the result of each comparing the erase operation sequence count values CNT1, CNT2, CNT3, and CNT4 and the expected count values.

In implementations, the scheduler 1310 may generate the program operation control signals in response to a program command PGM of an SLC mode or a TLC mode, and the operation sequence verification circuit 1400 may store the program operation sequence count values CNT6, CNT7, CNT8, and CNT9 obtained by counting the number of times by which the selected program operation control signal among the program operation control signals is toggled. The operation sequence verification circuit 1400 may output the pass or fail data PASS or FAIL representing the result of verifying the defect of the program operation to the outside based on the result of each comparing the program operation sequence count values CNT6, CNT7, CNT8, and CNT9 and the expected count values.

In the same way, in response to the read command READ, a plane-independent read command PIR READ, a re-program command RE PGM, a cache program command CACHE PGM, a cache read command CACHE READ, and a copy-back command COPY BACK, the operation sequence verification circuit 1400 may store the operation sequence count value obtained by counting the number of times by which the selected operation control signal among the operation control signals generated by the scheduler 1310 is toggled and may output the pass or fail data representing the result of verifying the defect of the operation to the outside.

Figure 8:
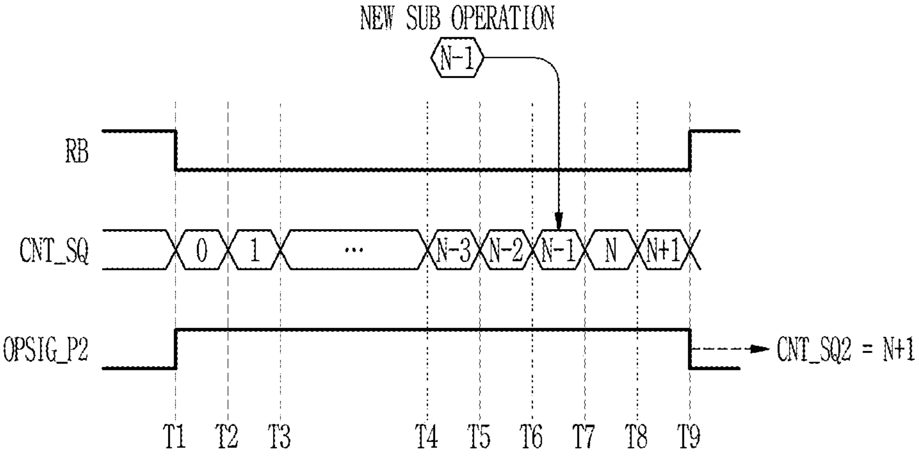

FIG. 8 and FIG. 9 are drawings for explaining an operation sequence verification circuit configured to verify a defect of a new sub-operation according to implementations.

Referring to FIG. 8, the new sub-operation may be added to the operation with respect to the second plane 1120. In implementations, the new sub-operation may be added to the section in which the operation sequence count value CNT_SQ corresponds to "N−1".

The operation sequence verification circuit 1400 may perform the count operation of counting the number of times by which the selected second operation control signal among the second operation control signals OPSIG_CTRL2 for controlling the operation added with the new sub-operation is toggled. In implementations, the operation sequence verification circuit 1400 may, while the second plane operation signal OPSIG_P2 is activated, perform the count operation.

The second operation sequence count value CNT_SQ2 corresponding to the result of performing the count operation may be "N+1" increased from "N", which is the second operation sequence count value CNT_SQ2 of FIG. 2, as the new sub-operation is added. The operation sequence verification circuit 1400 may output "N+1" corresponding to the second operation sequence count value CNT_SQ2 to the outside.

In implementations, the operation sequence verification circuit 1400 may output the pass or fail data to the outside based on the result of comparing "N+1" corresponding to the second operation sequence count value CNT_SQ2 with the expected count value. When the second operation sequence count value CNT_SQ2 is equal to the expected count value, the operation sequence verification circuit 1400 may output the pass data to the outside, and when the second operation sequence count value CNT_SQ2 and the expected count value are different from each other, it may output the fail data to the outside.

Referring to FIG. 9, the operation sequence verification circuit 1400 may generate the stop signal that stops an operation including the new sub-operation based on a stop count value CNT_STOP.

In implementations, the operation sequence verification circuit 1400 may receive the stop count value CNT_STOP corresponding to "N−2" as the third input signal IN_SIG3. At the time point T6, when the second operation sequence count value reaches "N−2", the operation sequence verification circuit 1400 may provide the stop signal to the scheduler 1310. The scheduler 1310 may inactivate a second plane operation signal OPISG_P2 in response to the stop signal. When the second plane operation signal OPISG_P2 is inactivated, the operation sequence verification circuit 1400 may stop the count operation. The operation sequence verification circuit 1400 may output "N−2", which is the second operation sequence count value CNT_SQ2, to the outside.

In implementations, the operation sequence verification circuit 1400 may receive the stop count value CNT_STOP corresponding to "N−1" as the third input signal IN_SIG3, and at the time point T7, when the second operation sequence count value CNT_SQ2 reaches "N−1", it may provide the stop signal to the scheduler 1310. The operation sequence verification circuit 1400 may output "N−1", which is the second operation sequence count value CNT_SQ2, to the outside.

In implementations, a section T6 to T7 may be a section in which the new sub-operation is performed. The section in which the new sub-operation is performed may be a section in which the second operation sequence count value CNT_SQ2 corresponds to "N−1". In implementations, the new sub-operation corresponding to the second operation sequence count value CNT_SQ2 of "N−1" may be verified by using the stop count value CNT_STOP corresponding to "N−2" and the stop count value CNT_STOP corresponding to "N−1". In implementations, the time required for performing the new sub-operation may be measured based on the result of comparing the time at which the operation corresponding to the command when the second operation sequence count value CNT_SQ2 is "N−2" with the time at which the operation corresponding to the command when the second operation sequence count value CNT_SQ2 is "N−1".

In implementations, the power and current consumed to perform the new sub-operation may be measured based on the result of comparing the power and current consumed to the operation corresponding to the command until the second operation sequence count value CNT_SQ2 is "N−2" with the power and current consumed to the operation until the second operation sequence count value CNT_SQ2 is "N−1". In implementations, by checking the data stored in the first to third latches 220 to 240 included in the page buffer 200 when the second operation sequence count value CNT_SQ2 is "N−1", whether the new sub-operation has been normally performed may be confirmed.

Figure 10:
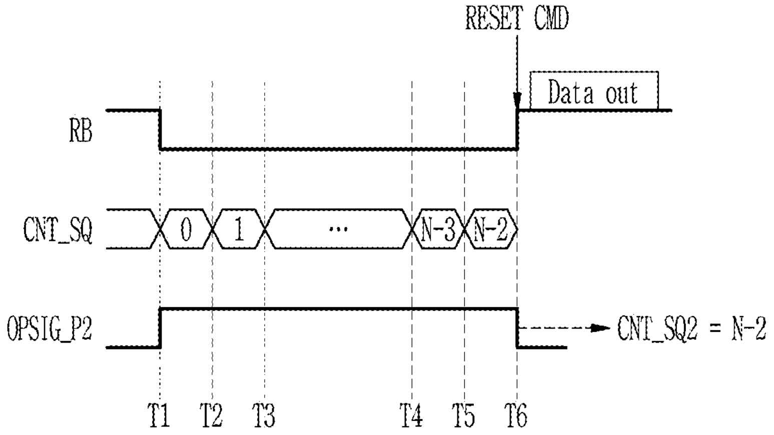
FIG. 10 is a drawing for explaining a reset command received based on an operation sequence count value according to implementations.

FIG. 10 is a drawing for explaining the reset command received based on an operation sequence count value according to implementations.

Referring to FIG. 10, the operation sequence verification circuit 1400 may perform the count operation for counting the selected second operation control signal among the second operation control signals OPSIG_CTRL2 while the second plane operation signal OPSIG_P2 is activated.

In implementations, at the time point T6, the scheduler 1310 may receive the reset command RESET CMD from the outside. The reset command RESET CMD may be a command that instructs stopping the operation corresponding to the command. In implementations, the scheduler 1310 may inactivate the second plane operation signal OPSIG_P2 in response to the reset command RESET CMD, and the operation sequence verification circuit 1400 may stop the count operation.

In implementations, when the reset command RESET CMD is received at the time point T6, among the sub-operations, sub-operations up to a section in which the second operation sequence count value CNT_SQ2 corresponds to "N−2 may be performed. In implementations, referring to FIG. 5, when N is "10", a section in which the second operation sequence count value CNT_SQ2 corresponds to "8" may be a section for performing the second sensing operation SENSING2. When the reset command RESET CMD is received at the time point T6, the sub-operations included in the read operation up to the second sensing operation SENSING2 may be performed.

In implementations, at the time point T6, after the operation corresponding to the command is stopped by the reset command RESET CMD, the data stored in the first to third latches 220 to 240 included in the page buffer 200 may be output to the outside (Data out). At the time point T6, the data stored in the first to third latches 220 to 240 may be data according to the result of sub-operations performed in the section in which the second operation sequence count value CNT_SQ2 corresponds to "N−2". At the time point T6, whether the sub-operation performed in the section in which the second operation sequence count value CNT_SQ2 corresponds to "N−2" has been normally performed may be verified based on the data stored in the first to third latches 220 to 240.

Figure 11:
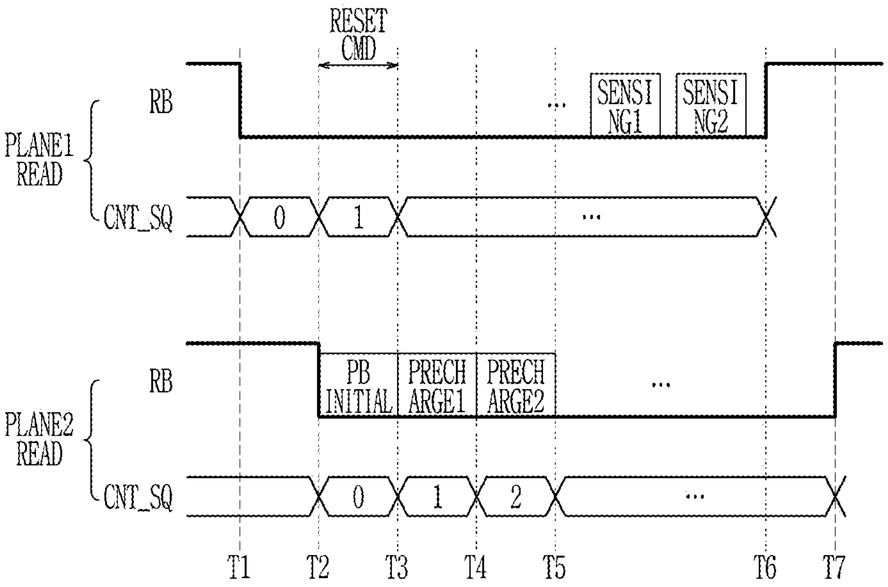
FIG. 11 is a drawing for explaining a sub-operation corresponding to an operation sequence count value according to implementations.

FIG. 11 is a drawing for explaining a sub-operation corresponding to an operation sequence count value according to implementations.

Referring to FIG. 11, the first plane 1110 and the second plane 1120 may parallelly perform the read operation in response to the read command received from the outside. In implementations, at the time point T1, the first plane 1110 may start the read operation, and at the time point T2, the second plane 1120 may start the read operation.

In implementations, when the second plane 1120 performs the read operation while the first plane 1110 performs the read operation, error bits may occur in the data stored in the first plane 1110. In implementations, in a section T5 to T6, the data sensed in the page buffer 200 by the first sensing operation SENSING1 and the second sensing operation SENSING2 with respect to the first plane 1110 may include error bits generated by the read operation with respect to the second plane 1120.

In implementations, whether error bits occurring in the data stored in the first plane 1110 occur due to some sub-operations among the sub-operations included in the read operation with respect to the second plane 1120 may be confirmed by using the operation sequence count value CNT_SQ and the reset command RESET CMD.

In implementations, when a difference between the number of error bits of the data stored in the page buffer 200 when the operation is stopped according to the reset command RESET CMD at the time point T2 and the number of error bits of the data stored in the page buffer 200 when the operation is stopped according to the reset command RESET CMD at the time point T3 is greater than a preset difference, it may be confirmed that error bits occur in the data stored in the first plane 1110 by the sub-operation performed in a section T2 to T3. The operation sequence count value CNT_SQ corresponding to the section T2 to T3 may be "0". The sub-operation corresponding to the section in which the operation sequence count value CNT_SQ is "0" may be the page buffer initialization operation PB INITIAL.

In implementations, the error bits occurring in the data stored in the first plane 1110 around the section T2 to T3 may be confirmed to have occurred by the page buffer initialization operation PB INITIAL with respect to the second plane 1120.

Figure 12:
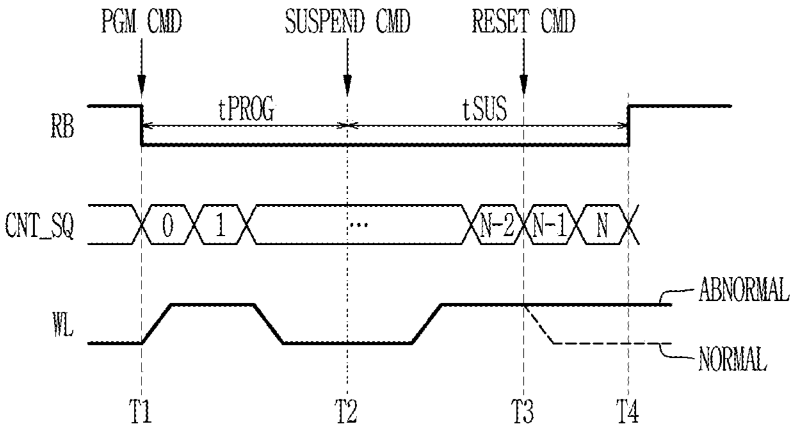
FIG. 12 is a drawing for explaining an operation sequence verification circuit configured to verify a defect of a wordline based on an operation sequence count value according to implementations.

FIG. 12 is a drawing for explaining an operation sequence verification circuit configured to verify a defect of a wordline based on an operation sequence count value according to implementations.

Referring to FIG. 12, at the time point T1, the non-volatile memory device 1000 may receive the program command PGM CMD from the outside. In the section T1 to T2, the non-volatile memory device 1000 may perform the program operation of storing data in the first to fourth planes 1110 to 1140. In the section T1 to T2, while performing the program operation, the program voltage and a program pass voltage may be applied to wordlines WL.

At the time point T2, the non-volatile memory device 1000 may receive a suspend command SUSPEND CMD that instructs the non-volatile memory device to stop the program operation. In the section T2 to T3, the program operation with respect to the first to fourth planes 1110 to 1140 may be stopped.

At the time point T3, the non-volatile memory device 1000 may receive the reset command RESET CMD. The non-volatile memory device 1000 may discharge the voltage of the wordlines WL in response to the reset command RESET CMD. When the voltage of the wordlines WL is discharged according to the reset command RESET CMD, it is a normal case, but an abnormal case may occur in which the voltage of the wordlines WL is not discharged even if the reset command RESET CMD is received.

In implementations, when the reset command RESET CMD is received by using the operation sequence count value CNT_SQ, whether the voltage of the wordlines WL is discharged may be easily confirmed. In implementations, when the abnormal case in which the voltage of the wordlines is not discharged in a section in which the operation sequence count value corresponds to "N−2" frequently occurs, the reset command RESET CMD may be accurately received at a time point at which the operation sequence count value CNT_SQ corresponds to "N−2" by using the operation sequence count value CNT_SQ, and whether the voltage of the wordlines WL is discharged at the time point at which the operation sequence count value CNT_SQ corresponds to "N−2" may be accurately confirmed.

Figure 13:
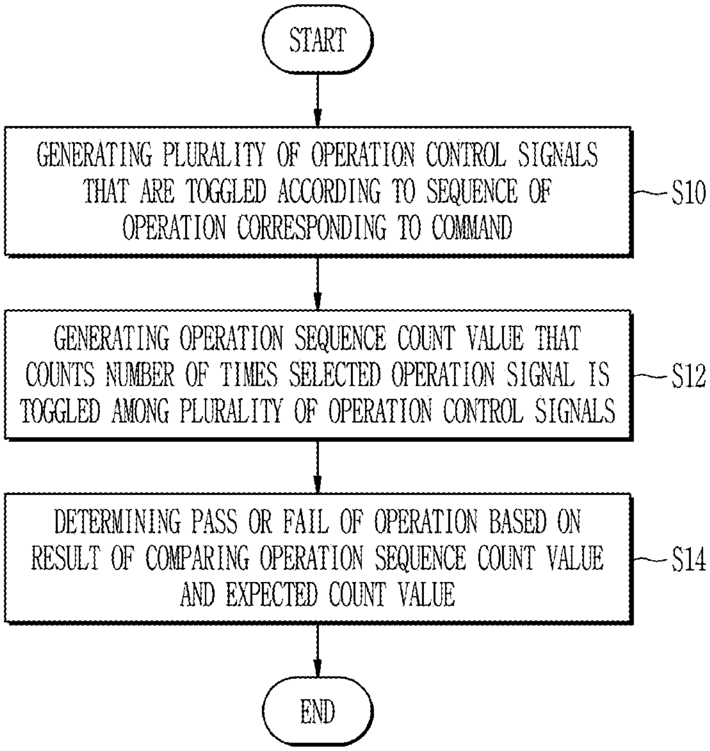
FIG. 13 is a flowchart for explaining a non-volatile memory device configured to verify a defect of an operation based on an operation sequence count value according to implementations.

FIG. 13 is a flowchart for explaining a non-volatile memory device configured to verify a defect of an operation based on an operation sequence count value according to implementations.

At step S10, the non-volatile memory device 1000 may generate the plurality of operation control signals toggled according to the sequence of operations corresponding to commands. The plurality of operation control signals may be a signal toggled for each section in which sub-operations included in the operation are performed. The plurality of operation control signals may be signals for inactivating the plurality of sub-operation control signals that control the sub-operations, respectively.

At step S12, the non-volatile memory device 1000 may generate the operation sequence count value obtained by counting the number of times by which the selected operation control signal among the plurality of operation control signals is toggled. The non-volatile memory device 1000 may output the operation sequence count value to the outside.

At step S14, the non-volatile memory device 1000 may determine pass or fail of the operation based on the result of comparing the operation sequence count value and the expected count value. The non-volatile memory device 1000 may output data representing pass or fail of the operation to the outside.

Figure 14:
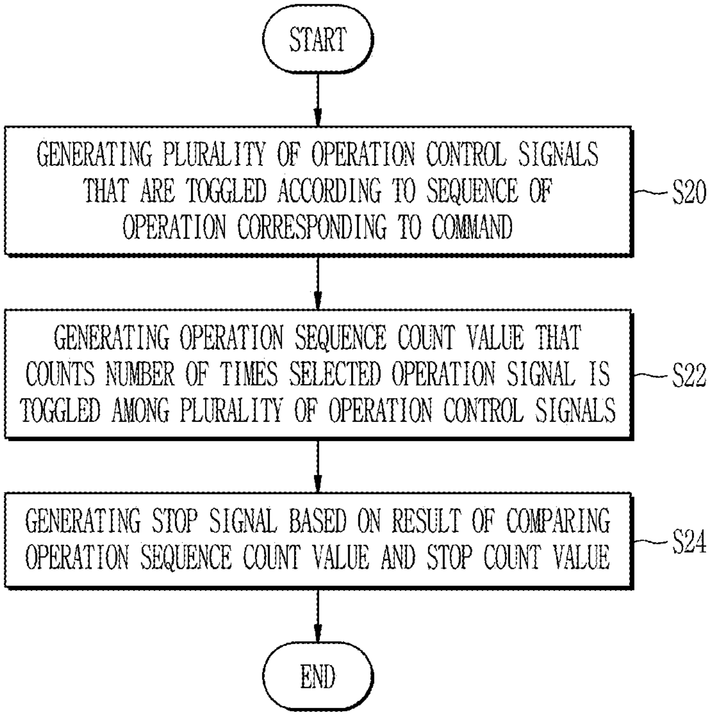
FIG. 14 is a flowchart for explaining a non-volatile memory device configured to stop an operation based on an operation sequence count value according to implementations.

FIG. 14 is a flowchart for explaining a non-volatile memory device configured to stop an operation based on an operation sequence count value according to implementations.

At step S20, the non-volatile memory device 1000 may generate the plurality of operation control signals toggled according to the sequence of operations corresponding to commands.

At step S22, the non-volatile memory device 1000 may generate the operation sequence count value obtained by counting the number of times by which the selected operation control signal among the plurality of operation control signals is toggled.

At step S24, the non-volatile memory device 1000 may generate the stop signal based on the result of comparing the operation sequence count value and the stop count value. According to the stop signal, the operation corresponding to the command may be stopped. In implementations, the scheduler 1310 may inactivate operation signals that control the operation corresponding to the command according to the stop signal. In implementations, the operation sequence verification circuit 1400 may stop the count operation of counting the number of times by which the selected operation control signal is toggled according to the inactivated operation signals. The operation sequence verification circuit 1400 may output the operation sequence count value of the stopped time point to the outside.

Figure 15:
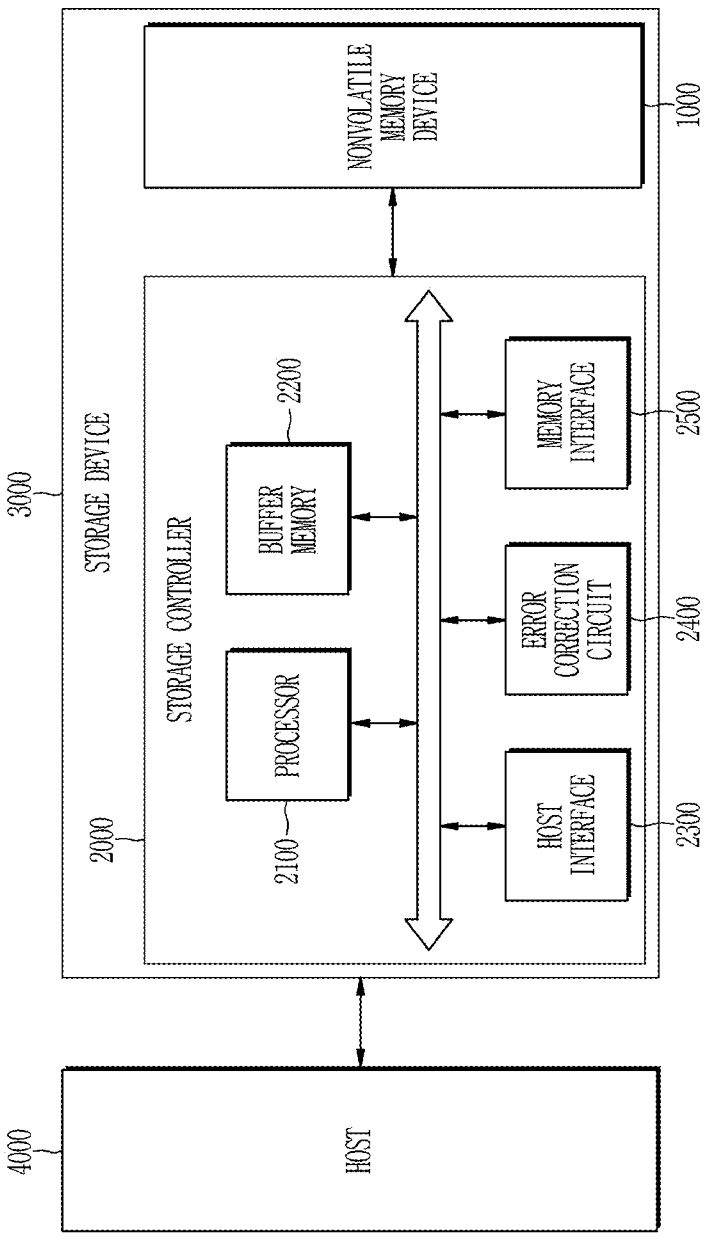
FIG. 15 is a drawing for explaining a storage device including a non-volatile memory device.

FIG. 15 is a drawing for explaining a storage device including a non-volatile memory device.

Referring to FIG. 15, an electronic system 50 may include a storage device 3000 and a host 4000.

The storage device 3000 may be a device that stores data according to the control of the host 4000. In implementations, the storage device 3000 may be manufactured in the form of a solid-state drive (SSD) or Universal Flash Storage (UFS).

The storage device 3000 may include the non-volatile memory device 1000 and a storage controller 2000.

The non-volatile memory device 1000 may store data. The non-volatile memory device 1000 may operate in response to the control of the storage controller 2000. In implementations, the non-volatile memory device 1000 may be a NAND flash memory. The non-volatile memory device 1000 may include a plurality of planes. Each of the plurality of planes may include a plurality of memory blocks. Each of the plurality of memory blocks may include the plurality of memory cells.

The non-volatile memory device 1000 may receive command and address from the storage controller 2000 and may perform an operation indicated by a command with respect to a region selected by the address. The non-volatile memory device 1000 may perform the program operation (e.g., write operation) for storing data in a region selected by the address, the read operation for reading data, or the erase operation for erasing data.

The non-volatile memory device 1000 may generate the plurality of operation control signals toggled according to the sequence of operations corresponding to commands from the storage controller 2000. The non-volatile memory device 1000 may perform the count operation of counting the number of times by which the selected operation control signal among the plurality of operation control signals is toggled. The non-volatile memory device 1000 may generate the pass or fail data representing the result of verifying the defect of the operation corresponding to the command based on the result of comparing the operation sequence count value corresponding to the result of the count operation with the expected count value. The non-volatile memory device 1000 may stop the operation corresponding to the command based on the result of comparing the operation sequence count value and the stop count value.

The storage controller 2000 may control the overall operation of the storage device 3000.

In implementations, when power is applied to the storage device 3000, the storage controller 2000 may execute firmware. The firmware may include a host interface layer configured to control communication with the host 4000, a flash translation layer configured to control communication between the host 4000 and the non-volatile memory device 1000, and a memory interface layer configured to control communication with the non-volatile memory device 1000. In implementations, the flash translation layer may convert a logical address of the host 4000 into a physical address of the non-volatile memory device 1000.

In implementations, the storage controller 2000 may control the non-volatile memory device 1000, to perform the write operation, the read operation, the erase operation, or the like, according to a request of the host 4000. For the write operation, the storage controller 2000 may provide a write command, address, and data to the non-volatile memory device 1000. For the read operation, the storage controller 2000 may provide the read command and address to the non-volatile memory device 1000. For the erase operation, the storage controller 2000 may provide an erase command and address to the non-volatile memory device 1000.

In implementations, the storage controller 2000 may include a processor 2100, a buffer memory 2200, a host interface 2300, an error correction circuit 2400, and a memory interface 2500.

The processor 2100 may control the overall operation of the storage controller 2000. The processor 2100 may control the operation of the storage controller 2000 to store data requested from the host 4000 in the non-volatile memory device 1000.

A volatile memory 2200 may be used as a buffer memory, a cache memory, an operating memory, or the like of the storage controller 2000.

The volatile memory 2200 may temporarily store data provided from the host 4000 or may temporarily store data read from the non-volatile memory device 1000. In implementations, the volatile memory 2200 may be a dynamic random-access memory (DRAM) or a static random-access memory (SRAM).

The host interface 2300 may communicate with the host 4000. The host interface 2300 may receive data from the host 4000 or may provide data to the host 4000.

The error correction circuit 2400 may perform an error correction operation. In implementations, the error correction circuit 2400 may perform error correction encoding (ECC encoding) with respect to data to be stored in the non-volatile memory device 1000 through the memory interface 2500. The error-correction encoded data may be transferred to the non-volatile memory device 1000 through the memory interface 2500. In implementations, the error correction circuit 2400 may perform error correction decoding (ECC decoding) with respect to data received from the non-volatile memory device 1000.

The memory interface 2500 may communicate with the non-volatile memory device 1000. The memory interface 2500 may provide commands, addresses, and data to the non-volatile memory device 1000. The memory interface 2500 may receive the data stored in the non-volatile memory device 1000.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While this disclosure has been described in connection with what is presently considered to be practical implementations, it is to be understood that the disclosure is not limited to the disclosed implementations. On the contrary, it is intended to cover various modifications and equivalent arrangements included within the spirit and scope of the appended claims.

What is claimed is:

1. A memory device, comprising:

a memory cell array comprising a plurality of planes;

a peripheral circuit configured to perform an operation with respect to the plurality of planes;

a scheduler configured to control the peripheral circuit, to generate a plurality of operation control signals that are configured to toggle according to a sequence of sub-operations included in the operation, the scheduler being configured to perform the operation according to the plurality of operation control signals; and an operation sequence verification circuit configured to verify a defect of the operation based on a result of comparing an operation sequence count value with an expected count value, the operation sequence count value being obtained by counting a number of times by which a selected operation control signal among the plurality of operation control signals is toggled.

2. The memory device of claim 1, wherein:

the scheduler is configured to provide a plane operation signal to the operation sequence verification circuit while the plurality of planes perform the operation; and the operation sequence verification circuit is configured to count the number of times by which the selected operation control signal is toggled while the plane operation signal is received.

3. The memory device of claim 1, wherein the operation sequence verification circuit comprises:

an electronic fuse configured to generate a control selection signal for selecting one of the plurality of operation control signals; and a verification signal selection circuit configured to output an operation control signal of one of the plurality of operation control signals as the selected operation control signal based on the control selection signal.

4. The memory device of claim 1, wherein the operation sequence verification circuit comprises:

a counter circuit configured to count the number of times by which the selected operation control signal is toggled; and a comparator configured to generate pass or fail data representing a result of verifying the defect of the operation based on the result of comparing the operation sequence count value and the expected count value.

5. The memory device of claim 4, further comprising a state register configured to store an operation status data representing whether the operation has been completed, wherein the operation sequence verification circuit outputs the pass or fail data based on the operation status data.

6. The memory device of claim 1, wherein:

the operation sequence verification circuit is configured to stop operation of counting the number of times by which the selected operation control signal is toggled in response to a reset command, and configured to output the operation sequence count value.

7. The memory device of claim 1, wherein the selected operation control signal is toggled in each section where the sub-operations are performed.

8. The memory device of claim 1, wherein:

the scheduler is configured to generate sub-operation control signals that control the sub-operations, respectively; and the selected operation control signal includes a signal for inactivating the sub-operation control signals.

9. The memory device of claim 8, wherein the scheduler is configured to control a first sub-operation among the sub-operations based on a first sub-operation control signal among the sub-operation control signals, and wherein the scheduler is configured to, based on the selected operation control signal being toggled, control a second sub-operation subsequent to the first sub-operation based on a second sub-operation control signal subsequent to the first sub-operation control signal.

10. A memory device, comprising:

a scheduler configured to generate a plurality of operation control signals toggled according to a sequence of operations; and an operation sequence verification circuit configured to provide a stop signal for stopping an operation to the scheduler based on a result of comparing an operation sequence count value with a stop count value, the operation sequence count value being obtained by counting a number of times by which a selected operation control signal among the plurality of operation control signals is toggled.

11. The memory device of claim 10, further comprising a memory cell array comprising a plurality of planes configured to perform the operation in response to the plurality of operation control signals, wherein the scheduler is configured to inactivate an operation plane signal representing that an operation with respect to the plurality of planes is being performed, in response to the stop signal.

12. The memory device of claim 11, wherein the operation sequence verification circuit is configured to stop operation of counting the number of times by which the selected operation control signal is toggled according to the inactivated operation plane signal.

13. The memory device of claim 10, wherein the operation sequence verification circuit comprises an electronic fuse configured to generate a selection control signal for selecting one of the plurality of operation control signals.

14. The memory device of claim 13, wherein the operation sequence verification circuit comprises a verification signal selection circuit configured to output an operation control signal of one of the plurality of operation control signals as the selected operation control signal based on the selection control signal.

15. The memory device of claim 10, wherein the operation sequence verification circuit comprises:

a counter circuit configured to count the number of times by which the selected operation control signal is toggled; and a comparator configured to generate the stop signal when the operation sequence count value reaches the stop count value.

16. The memory device of claim 10, wherein:

the operation comprises sub-operations; and the operation sequence count value is a value corresponding to one section among sections performing the sub-operations.

17. A memory device, comprising:

a scheduler configured to activate, in response to a command, sub-operation control signals for controlling sub-operations included in an operation corresponding to the command, and to generate a termination signal for inactivating the sub-operation control signals for each section for performing the sub-operations; and an operation sequence verification circuit configured to stop the operation or to verify a defect of the operation by performing a count operation for counting a number of times by which the termination signal is toggled, and based on a result of comparing an operation sequence count value corresponding to the result of performing the count operation with a reference count value.

18. The memory device of claim 17, wherein the operation sequence verification circuit comprises a first comparator configured to output pass or fail data representing a result of verifying the defect of the operation based on the result of comparing the operation sequence count value and the reference count value.

19. The memory device of claim 17, wherein the operation sequence verification circuit comprises a second comparator configured to provide a stop signal for stopping the operation to the scheduler based on the result of comparing the operation sequence count value and the reference count value.

20. The memory device of claim 17, further comprising a plurality of page buffers configured to perform a first sub-operation among the sub-operations in response to a first sub-operation control signal among the sub-operation control signals, and when the termination signal is toggled, to perform a second sub-operation subsequent to the first sub-operation in response to a second sub-operation control signal subsequent to the first sub-operation control signal.

* * * * *